United States Patent [19]

Nishioka

[11] Patent Number: 4,661,717

[45] Date of Patent: Apr. 28, 1987

[54] LOAD CONDITION DETERMINING APPARATUS

[75] Inventor: Tetsuji Nishioka, Isezaki, Japan

[73] Assignee: Nissan Motor Co., Ltd., Yokohama, Japan

[21] Appl. No.: 795,460

[22] Filed: Nov. 6, 1985

[30] Foreign Application Priority Data

Nov. 19, 1984 [JP] Japan .................. 59-242436

[51] Int. Cl.⁴ .................. H02J 3/14; G08B 21/00
[52] U.S. Cl. .................. 307/10 LS; 307/10 R; 307/39; 340/80; 315/83
[58] Field of Search ............ 307/10 LS, 10 R, 10 BP, 307/9, 39; 324/51, 52, 54, 55; 340/51, 52, 81 R, 66, 67, 74, 81 F, 82, 83, 84, 73, 80; 315/83; 361/33, 37, 56, 59, 60, 64, 65, 79, 82, 86, 87, 88, 90, 91, 92, 93; 364/424

[56] References Cited

U.S. PATENT DOCUMENTS

| 3,671,955 | 6/1972 | Malekzadeh ............ 315/83 X |
| 3,869,664 | 3/1975 | Safer et al. ............ 324/51 |
| 3,876,975 | 4/1975 | Sakurai ............ 340/52 R |
| 4,105,996 | 8/1978 | Shimizu ............ 340/73 |
| 4,173,750 | 11/1979 | Riba ............ 340/80 |
| 4,236,143 | 11/1980 | Mizuno ............ 340/73 |
| 4,246,566 | 1/1981 | Endo et al. ............ 340/52 F |
| 4,259,659 | 3/1981 | Ariyoshi et al. ............ 340/73 |
| 4,291,302 | 9/1981 | King et al. ............ 340/74 X |
| 4,318,152 | 3/1982 | Weber ............ 361/92 |
| 4,333,122 | 6/1982 | Hayden et al. ............ 361/92 |
| 4,349,810 | 9/1982 | Kugo et al. ............ 340/73 X |
| 4,499,385 | 2/1985 | Slavik ............ 307/39 X |
| 4,550,303 | 10/1985 | Steele ............ 340/81 R X |

FOREIGN PATENT DOCUMENTS

| 0043516 | 1/1982 | European Pat. Off. . |
| 58-139624 | 8/1983 | Japan . |
| 58-222554 | 12/1983 | Japan . |
| 405339 | 5/1934 | United Kingdom . |
| 550135 | 12/1942 | United Kingdom . |
| 1021705 | 3/1966 | United Kingdom . |
| 1087478 | 10/1967 | United Kingdom . |
| 1245781 | 9/1971 | United Kingdom . |
| 1578081 | 10/1980 | United Kingdom . |

Primary Examiner—William M. Shoop, Jr.
Assistant Examiner—Shik Luen Paul Ip
Attorney, Agent, or Firm—Schwartz, Jeffery, Schwaab, Mack, Blumenthal & Evans

[57] ABSTRACT

A load condition determining apparatus having a drive circuit having first and second MOS-transistors, the drains of the MOS-transistors are connected to a power supply respectively, the control-gate thereof are connected to a voltage stepping circuit, and the source of the first MOS-transistor is connected both to a load circuit and to one input terminal of a differential amplifier while the source of the second MOS-transistor is connected both to a load equivalence circuit having resistors and a capacitor and to the other input terminal of the amplifier. The resistance of the load equivalence circuit is equalized with the resultant resistance component of the load circuit while the time constant of the capacitance and part of the resistance of the load equivalence circuit is modeled after the rush current of the load circuit, when operated, in the apparatus according to the invention. The normal and abnormal conditions of the load circuit can be determined by the occurrence of the balance and the unbalance between input voltages to the differential amplifier from the sources of the MOS-transistors in accordance with the normal condition, the short-circuited condition, or the disconnected condition of the load circuit. In order to distinguish the abnormal conditions from a provisional change in the load circuit, the upper and lower threshhold voltage levels are provided in a comparing circuit.

15 Claims, 5 Drawing Figures

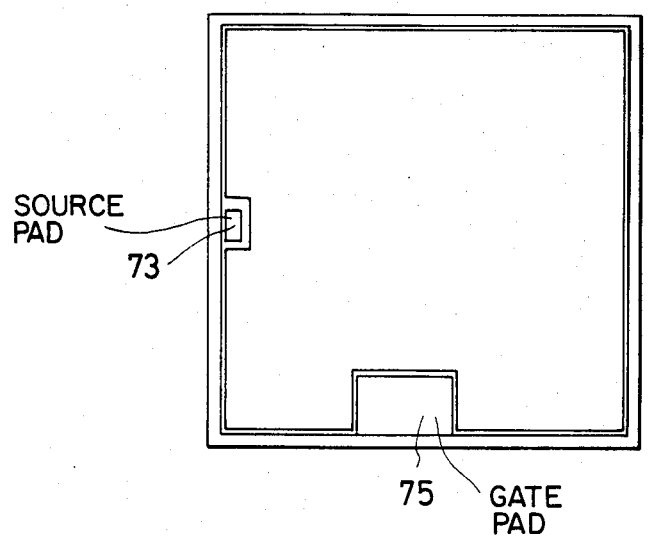

LOAD CONDITION DETERMINING APPARATUS

BACKGROUND OF THE INVENTION (1) Field of the Invention

The present invention relates to a load condition determining apparatus adapted to accurately and effectively detect electrical load conditions of a load consisting of, for instance, various lamps equipped in vehicles.

(2) Description of the Prior Art

It is important to supervise or monitor operating conditions of different lights and lamps, such as headlights, tail lamps, brake lamps, to detect any abnormal conditions such as any short circuit or disconnection of the lights and lamps, and to inform the driver of the vehicle of the abnormal conditions thus detected in order to maintain a safe running vehicle.

Conventionally, a method has been proposed in which a load current flowing through a switching element, e.g., power MOS-type transistor or the voltage $V_{DS}$ between the drain-source of the transistor connected in series to the load so as to drive the load, is monitored in order to detect the short-circuited condition or disconnected condition of the load such as the lamps and the like (see, for instance, Japanese Patent Disclosures 139624/1983 and 222554/1983).

In the monitoring method according to the prior art, a low value resistor is connected in series to the MOS-type transistor and the voltage across the resistor is monitored in order to detect the load current flowing through the MOS-transistor and to detect the short-circuited condition. However, since the current has the same amplitude as that of the lamp driving current, e.g., the current of about a few amperes flows through the resistor always when driving the lamps, there was a problem that the outer shape of the resistor and the power consumption became large.

Furthermore, when a rush current flows through the load such as lamps at the time of turning on a power supply, it is normal that a short circuit current during a time period corresponding to the rush current, e.g., a few tenths of msecs is not monitored in order to avoid mistaken detection of the rush current as the short circuit current. Accordingly, during at least the time period described above, a large thermal dissipation plate must be provided so as not to damage the MOS-transistor even when the current corresponding to the short circuit current flows through the MOS-transistor.

On the other hand, in the method for monitoring the voltage drop between the drain and source of the MOS-transistor to detect the disconnection of the lamps according to the prior art, since the voltage drop depends upon the on-time resistance of the MOS-transistor and upon the temperature characteristic, another correction circuit is required in order to correct errors due to the dispersion among the on-time resistances of the MOS-transistors and the change in the voltage characteristic of each of the MOS-transistors the loads are connected in parallel as in the case of brake lamps having two to four lamps in number. Accordingly, this has made the method according to the prior art uneconomical.

SUMMARY OF THE INVENTION

It is therefore an object of the present invention to provide a load condition determining apparatus capable of accurately and rapidly detecting normal and abnormal conditions of a load.

It is another object of the present invention to provide a load condition determining apparatus in which fluctuation in the electrical characteristic due to, for a change in temperature, can be eliminated and normal and abnormal conditons can be accurately and economically detected without necessitating any correction circuit.

It is yet another object of the present invention to provide a load condition determining apparatus in which the abnormal conditions of a load can be determined by driving the load, the condition of which should be determined, through first switching means, then driving a load equivalence circuit means having substantially the same electrical characteristic as that of the load through said first switching means together with a second switching means formed on a single chip, and finally comparing the output signal from the first switching means with the output signal from the second switching means, thereby determining the normal and abnormal conditions of the load in accordance with the output signals from the first and second switching means.

According to the present invention, one feature of the load condition determining apparatus comprises: a power supply; a drive circuit having first and second type transistors and connected to the power supply at one end thereof; a load circuit, one end of which is connected to the output of the first type transistor in the drive circuit and the other end of which is connected to ground; a load equivalence circuit having resistors and a capacitor, one end of which is connected to the output of the second type transistor in the drive circuit and the other end of which is connected to ground, the electrical characteristics of the load equivalence circuit being substantially equal to that of the load circuit; a differential amplifier circuit, the differential inputs of which are connected to the outputs of the first and second type transistors respectively so as to detect the difference between the input voltages to the differential amplifier circuit in accordance with the conditions of the load circuit; and comparing means having first and second comparators with first and second reference voltage levels respectively and connected to the output of the differential amplifier circuit at the input thereof, thereby determining the normal and abnormal conditions of the load circuit in accordance with the balance and unbalance between the input voltages to the differential amplifier circuit.

These and other objects, features, and advantages of the invention will be better understood from the following detailed description of the invention with reference to the attached drawings.

BRIEF DESCRIPTION OF THE INVENTION

FIG. 1 illustrates an electrical circuit diagram of one embodiment of the load condition determining apparatus according to the present invention, FIG. 2a illustrates a single chip surface of the first MOS-transistor in the drive circuit shown in FIG. 1, FIG. 2b illustrates a single chip surface of the second MOS-transistor in the drive circuit shown in FIG. 1, FIG. 3 illustrates a partial cross-sectional view of the chip shown in FIG. 2, and FIG. 4 illustrates an equivalence electrical circuit of the chip shown in FIG. 3.

DESCRIPTION OF PREFERRED EMBODIMENT

Figure 1:
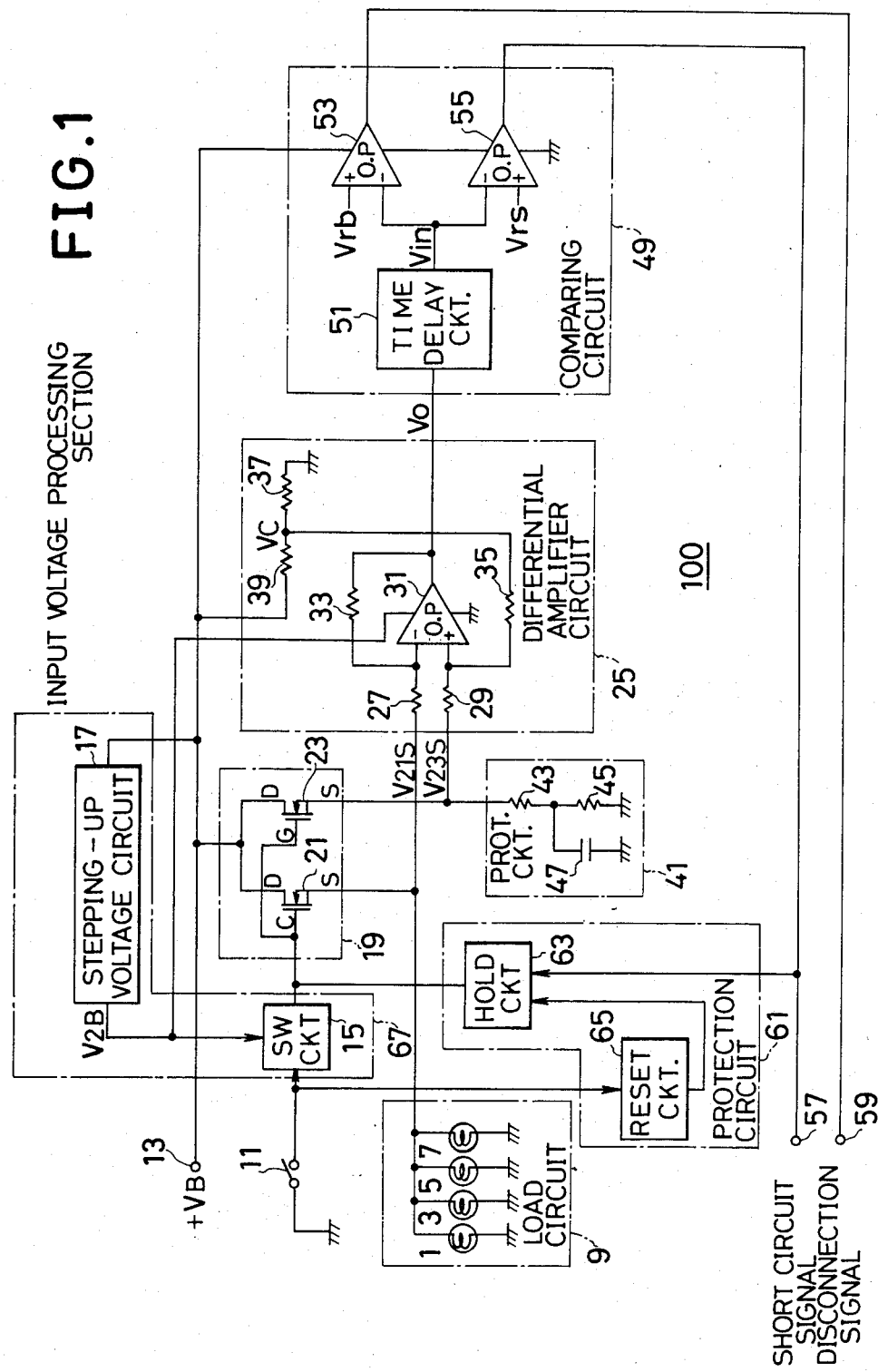

Referring to FIG. 1, the load condition determining apparatus 100 comprises a load circuit 9 consisting of lamps 1, 3, 5, and 7, a drive circuit 19, a differential circuit 25, a load equivalence circuit 41, a comparing circuit 49, a protection circuit 61, and an input voltage processing section 67.

In the load condition determining apparatus according to the present invention, the four lamps 1, 3, 5 and 7 constituting the load circuit 9 are drivably controlled by turning on and off a switch 11. In the drivably controlled condition of the load circuit 9, the breaking or disconnection of a filament in a lamp or lamps or any short-circuited condition of the lamps 1, 3, 5 or 7 is detected. Namely, when any of the lamps is broken down or disconnected or short-circuited, the abnormal conditions can be detected and either a short circuit signal Ss or a disconnection signal Sb is produced at the output terminal 57 for the short circuit or at the output terminal 59 for the disconnection of the lamps, thus indicating the occurrence of any abnormal conditions on, for instance, a maintenance panel not shown.

The load condition determining apparatus operates with the power supply voltage $+V_B$ which is supplied to the power supply terminal 13. One end of switch 11 is connected to the ground and the other end of which is connected to the each gate of the N-channel power MOS-transistors 21 for driving the load circuit 9 constructed by the lamps 1, 3, 5 and 7, and the N-channel MOS-transistor 23 for driving the load equivalence circuit 41 through a switching circuit 15. The two MOS-transistors 21 and 23 constitute the drive circuit 19. Since each of the MOS-transistors 21 and 23 constitutes a source-follower respectively, with the source thereof connected to the load and then to the ground respectively, the voltage $V_{23}$ which is two times larger than the power supply voltage $+V_B$ after being stepped-up through the circuit 17, is applied to the gates of the MOS-transistors 21 and 23 through the switching circuit 15. Accordingly, each of the transistors 21 and 23 is ON/OFF controlled by the voltage $V_{2B}$. The drains of the MOS-transistors 21 and 23 are connected to each other and the power supply voltage $+V_B$ is supplied thereto. The source of the transistor 23 for the load equivalent circuit 41 is connected to ground through one resistor 43 and another resistor 45. The junction of the resistors 43 and 45 is connected to ground through a capacitor 47.

The load equivalence circuit 41 constitutes an electrically equivalent circuit to the load circuit 9 consisting of the lamps 1, 3, 5 and 7, with the resistors 43 and 45 connected in series. In other words it is modeled after, or is equivalent to, the resultant resistance of the lamps connected in parallel, which constitute the load circuit 9. The capacitor 47 connected in parallel to the resistor 45 serves to flow a current corresponding to the rush current when the lamps are turned on, i.e., they are lighted.

The sources of the MOS-transistors 21 and 23 are connected to the inverting input terminal (−) of an operational amplifier 31 through the resistors 27 and to the non-inverting input terminal (+) of the operational amplifier 31 through the resistor 29 respectively, which constitutes a differential amplifier circuit 25.

To the operational amplifier 31, there is supplied the voltage $V_{2B}$ which is two times larger than the power supply voltage $V_B$, which is supplied from the voltage stepping-up circuit 17. The resistor 33 is connected between the inverting input terminal (−) of the operational amplifier 31 and the output terminal of the amplifier 31. The resistor 35, one end of which is connected to the non-inverting terminal of the operational amplifier 31 is connected to the junction between the resistors 37 and 39 at the other end thereof.

The other end of the resistor 39 is connected to the power supply $+V_B$ while the other end of the resistor 37 is connected to ground. The junction of the resistors 39 and 37 connected in series provides a neutral voltage $V_c$. The values of the resistors 37 and 39 are selected in such a manner that the neutral voltage $V_c$ is equal to one tenth of the power supply $+V_B$, i.e., $V_C = V_B/10$.

The output of the operational amplifier 31 produces a voltage corresponding to the difference of the two input voltages supplied by the resistors 27 and 29 in the differential amplifier circuit 25. Supposing now that the output voltage from the operational amplifier 31 is equal to $V_o$ and the source voltages of the MOS-transistors 21 and 23 to be supplied to the amplifier 31 through the resistors 27 and 29 are equal to $V_{21s}$ and $V_{23s}$ respectively, the equation of the output voltage $V_o$ can be expressed as follows;

$$V_o = (V_{23s} - V_{21s}) + V_c \quad (1)$$

Further, supposing that the values of the resistors 27, 29, 33, and 35 are equal to R27, R29, R33, and R35, it follows that the amplification factor $\mu = R33/R27 = R35/R29$.

The input voltages $V_{21s}$ and $V_{23s}$ supplied to the differential amplifier circuit 25 become equal to each other in no normal condition where no short-circuited condition or the disconnection of the lamps occurs in the load circuit 9. As a result, the output voltage $V_o$ from the different amplifier circuit 25 becomes equal to the neutral voltage $V_c$.

However, when any short-circuited condition of the lamps occurs, the voltage $V_{21s}$ becomes small, with the result that the differential output voltage $V_o$ from the differential amplifier circuit 25 becomes large. On the other hand, when any of the lamps in the load circuit 9 is disconnected, the resultant resistance of the load circuit becomes large, the voltage $V_{21s}$ becomes large and the differential output voltage $V_o$ from the differential amplifier circuit 25 becomes small. Namely, the output voltage $V_o$ from the differential amplifier circuit 25 becomes higher than or lower than the normal value, depending upon either the short-circuited condition or the breakdown or disconnected condition of the lamps in the load circuit 9.

The subsequent comparing circuit 49 monitors the conditions by comparing the output voltage $V_o$ with a predetermined voltage if the former voltage is higher or lower than the latter voltage.

In order to realize the above described function, the output of the differential amplifier circuit 25 is connected to a time delay circuit 51 in the comparing circuit 49. The purpose of the delay circuit 51 is to remove noise and it may comprise an RC circuit consisting of a capacitor and a resistor. The output signal from the delay circuit 51, with the noise removed, is applied to the inverting input terminals of a comparator 53 for detecting the disconnection of the lamps and of another comparator 55 for detecting the short-circuited condition of the lamps in the load circuit 9, as an input voltage Vin. The non-inverting input terminal of the comparator 53 is supplied with a reference voltage Vrb for detecting the disconnected condition of the lamps, while the non-inverting input terminal of the comparator 55 is supplied with another reference voltage Vrs for detecting the short-circuited condition of the lamps in the load circuit 9. The power supply $+V_B$ is also supplied to the comparators 53 and 55.

When the input voltage Vin applied to the comparators 53 and 55 from the differential amplifier circuit 25 through the time delay circuit 51 is smaller than the predetermined reference voltage Vrb for the detection of the disconnection of the lamps, a disconnection signal $S_B$ is produced from the output of the comparator 53 for detecting the disconnection. On the other hand, when the input voltage Vin is larger than the reference voltage Vrs for the detection of the short-circuited condition of the lamps in the load circuit 9, a short circuit signal $S_s$ produced from the output of the comparator 55 for detecting the short-circuited condition of the lamps.

Description will now be made for a case where the four lamps in the load circuit 9 are stop lamps, the power consumption of each lamp is determined to be equal to 21 watts, the power supply $+V_B$ is 12 V and $\mu$ is equal to 10, in order to set up the predetermined reference voltage Vrb for detecting the disconnection and the predetermined reference voltage Vrs for detecting the short circuit. The reference voltage Vrb of the comparator 53 for the detection of the disconnection is set up so that comparator 53 produces a disconnection signal $S_B$ when the current consumption for one lamp is reduced to 60%, a thereby indicating as the disconnection of a lamp or lamps among the four lamps. In similar manner to the above case, the reference voltage Vrs is set up so that comparator 55 produces a short-circuit signal $S_s$ when the current is three times higher than the current for the four lamps, thereby indicating a short-circuited condition.

The output voltage $V_o$ of the differential amplifier circuit 25, i.e., the input voltage Vin to the comparators 53 and 55, in case of the disconnection of any one lamp of the four lamps 1, 3, 5, or 7 can be expressed as follows:

$$V_o = (VB/10) - (21/12) \times 50 \times 10$$
$$= (VB/10) - 0.875 = 0.325$$

where the unit of numeral 50 in the above equation is million and it indicates the on-time resistance of the power MOS-transistor for driving the lamps.

The output voltage $V_o$ in case of a short circuit condition of the lamps, i.e., when the current is three times higher than that of the four lamps, is as follows:

$$V_o = (VB/10) + (21/12) \times 4 \times (4-1) \times 50 \times 10$$
$$= (VB/10) + 10.5 = 11.7$$

From the above values, the reference voltage Vrb of the comparator 53 for detecting the disconnection and the reference voltage Vrb of the comparator 55 for detecting the short-circuited condition of the lamps are set up at 0.47 V and 8.0 V, respectively taking into consideration the power supply fluctuation.

When the load circuit 9 is short-circuited, a large current flows through the MOS-transistor 21 for driving the lamps. Thus, there is a possibility that the MOS-transistor 21 will break down. In order to prevent this breakdown, the short circuit signal Ss detected by the comparator 55 is applied to the hold circuit 63 in the protection circuit 61. Accordingly, when the signal Ss is applied to the hold circuit 63, the transistors 21 and 23 are turned off by the output signal from the circuit 63 and this condition is maintained. In addition, another input of the hold circuit 63 is connected to the output of the reset circuit 65 and the input of the reset circuit 65 is connected to the switch 11. Accordingly, when the switch 11 is turned off, the hold circuit 63 is reset to the initial condition by a reset signal from the reset circuit 65 and the MOS-transistors 21 and 23 are released from the off-condition.

Figure 2A:
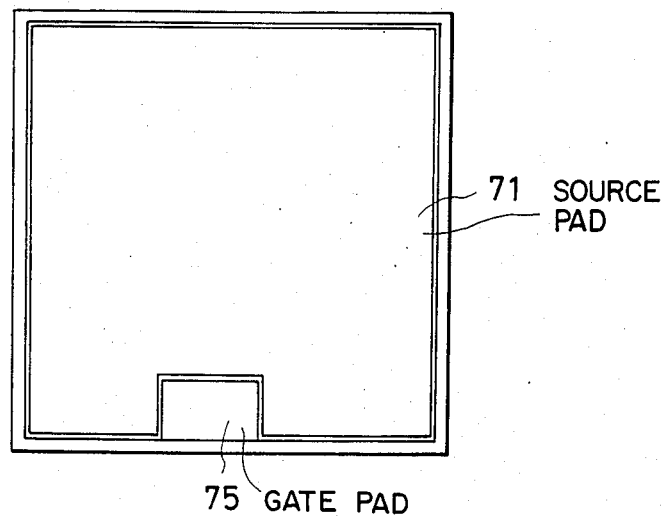
Figure 3:
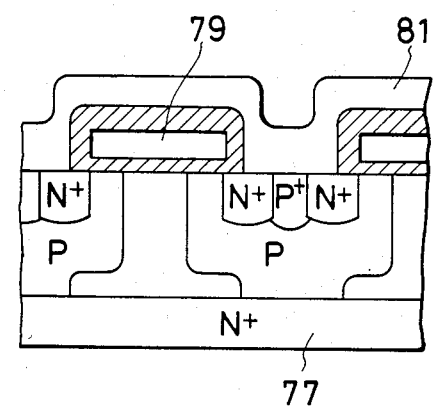
Figure 4:
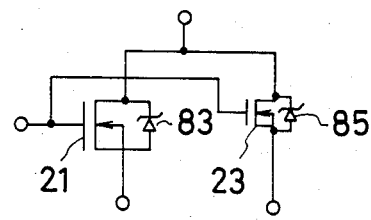

The MOS-transistors 21 and 23 constituting the drive circuit 19 are constructed by one chip as shown in FIGS. 2 to 4 so as to have equal electrical characteristics.

FIGS. 2a and 2b show the chip surface of the MOS-transistors 21 and 23, respectively, made of a single chip. FIG. 3 shows one portion of an enlarged cross-sectional view of the chip. FIG. 4 shows the equivalent circuit of the chip.

In FIG. 2a, reference numeral 71 indicates a source pad of the MOS-transistor 21 for driving the lamps as a load. In FIG. 2b, numeral 73 indicates a source pad of the MOS-transistor 23 for driving the load equivalence circuit 41. Numeral 75 in FIGS. 2a and 2b indicates a gate pad of both the MOS-transistors 21 and 23. As will be noted from the difference in the pad size between the transistors, the MOS-transistor 21 for driving the lamps is constructed by about 20,000 power cells so as to drive the load in ampere, while the MOS-transistor 23 for driving the load equivalent circuit is constructed by 40 unit cell power transistors, that is, about 1/500 of the power cells used in MOS-transistor 21.

Furthermore, the transistors 21 and 23 are constructed as N-channel MOS-transistors in a longitudinal structure as indicated in FIG. 3. Accordingly, a large current can be flowed through the chip. The chip is also made as a power MOS-transistor having a large tolerance for surge and its parasitic diodes act as zener diodes suitable for motor vehicles.

In FIG. 3, the chip comprises a gate 79, a drain 77, and a source 81. As shown in FIG. 4, in the MOS-transistors 21 and 23, the parasitic diodes 83, 85 which act as the zenor diodes are formed in parallel, so that even when a large surge voltage is applied between the source and the drain of the MOS-transistors respectively, damage to the transistors can be prevented. The size of the MOS-transistors made of one chip structure shown in FIG. 3 measures, for instance, 3.5 mm$\times$3.5 mm and its rear side of the chip forms the drain electrode.

In FIG. 2b, it is desirable to place the source pad 73 of the MOS-transistor for driving the load equivalence circuit 41 at a position where average channel temperature of the whole chip can be monitored and wire bond can be easily carried out.

The on-time resistance of each unit cell MOS-transistor is 1 kohms, so that the total on-time resistances of about the 20,000 power cells constituting the power MOS-transistor 21 for driving the lamps amounts to 50 ohms.

As described in the foregoing, the load circuit 9 is constructed with the four twenty-watt stop lamps connected in parallel. Accordingly, when the MOS-transistor 21 for driving the lamps is turned on, the source current $I_{21s}$ of the MOS-transistor 21 can be expressed by the following equation;

$$I_{21s} = 4(21/12)(V_B/12)$$

Moreover, the source voltage $V_{21s}$ of the MOS-transistor 21 for driving the lamps in this case can be expressed as follows;

$$V_{21s} = V_B - R_{on21} \times I_{21s}$$

The load equivalent circuit 41 is modeled after the load circuit 9 consisting of the lamps 1, 3, 5, and 7. Accordingly, each circuit constant is selected in such a manner that the voltage across each source of the MOS-transistors 21 and 23 in the normal condition, i.e., the input voltage $V_{21s}$ and $V_{23s}$ to the differential amplifier circuit 25, become equal to each other, that is, $V_{21s} = V_{23s}$. Accordingly, assuming now that the values of the resistors 43 and 45 are equal to R43 and R45, the resultant resistance of the two resistors connected in series will be as follows;

$$R43 + R45 = (20000/40) \times (R_L/4)$$
$$= (20000/40) \times (12^2/21 \times 4)$$
$$= 857(\Omega)$$

In addition, the source current $I_{23s}$ of the MOS-transistors 23 for driving the load equivalence circuit will be as follows;

$$I_{23s} = (40/20000) \times I_{21s}$$

The load equivalence circuit 41 is modeled as described in the foregoing, the rush current of the lamps and in this case. The resistance R43 and R45 determine the peak of the rush current, while the capacitor 47 and resistor 45 also determine the time constant of the rush current. The relationship amont the circuit constants is selected as follows, assuming that the resistances of the resistors 43 and 45 are R43 and R45, and the capacitance value of the capacitor 43 is C47, from the measurement of the actual lamps:

(R43+R45)/R43 = 7

R43·C47 = 10 msec.

The operation of the load condition determining apparatus according to the present invention will now be described.

In the normal operation, that is, when the lamps 1, 3, 5, and 7 constituting the load circuit 9 are operated without either the disconnected condition or the short-circuited condition, turning off the switch 11 causes the voltage $V_{2B}$, which is two times larger than the power supply voltage $+V_B$, to be applied to the gates of the N-channel power MOS-transistor 21 for driving the drive circuit 19 and to the N-channel MOS-transistor 23 for driving the load equivelnce circuit 41 through the switching circuit 15, after being stepped-up by the voltage stepping-up circuit 17. As a result, each of the MOS-transistors 21 and 23 is turned on and a current flows from the power supply $+V_B$ to the load circuit 9 and the load equivalence circuit 41 through the MOS-transistors 21 and 23, thus turning on the lamps 1, 3, 5, and 7. When each of the lamps is lighted, the rush current flows and the current corresponding to the rush current also flows through the load equivalence circuit 41 consisting of the resistor 43 and the capacitor 47 connected in series with the resistor 43. Accordingly, the voltage $V_{21s}$ and $V_{23s}$ to the differential implifier circuit 25 are always the same. As a result, the output voltage $V_o$ from the differential amplifier circuit 25 has only the neutral voltage Vc component as indicated by the equation (1) above. This output voltage $V_o$ is applied to one of the comparison inputs of the comparators 53 and 55 respectively, after removing noise through the time delay circuit 51 in the comparing section 49 and it is compared with the reference voltage Vrb of the comparator 53 for detecting the disconnection of the lamps and with the reference voltage Vrs of the comparator 55 for detecting the short-circuited condition, respectively.

In this case, the output voltage $V_o$ from the differential amplifier circuit 25 is equal to the neutral voltage Vc as described above. Accordingly, if the power supply $+V_B$ is 12 V, the neutral voltage 1.2 V, so that the output voltage V falls within the range defined by the reference voltage Vrb=0.47 V of the comparator 53 for detecting the disconnected condition of the lamps and the reference voltage Vrs=8.0 V of the comparator 55 for detecting the short-circuited condition of any of the lamps. Consequently, neither the disconnection signal Sb nor the short circuit signal $S_s$ is produced. As a result, the hold circuit 63 is not operated and the lamps in the load circuit 9 keep lighting during the turning-on condition of the switch 11. However, when the switch 11 is turned off, the input voltage to each gete of the MOS-transistors 21 and 23 are rendered non-conductive, thereby turning off the lamps. In this case, the input voltages $V_{21s}$ and $V_{23s}$ to be supplied to the differential amplifier circuit 25 are at ground potential and have equal values through the lamps in the load circuit 9 and the resistors in the load equivalence circuit 41. Accordingly, the output voltage $V_o$ from the differential amplifier circuit 25 presents the neutral voltage Vc as described in the foregoing, so that neither the disconnection signal Sb nor the short circuit signal Ss is produced from the comparing circuit 49.

Now, when any of the lamps in the load circuit 9 is disconnected the resultant resistance of the load circuit 9 becomes large. As a result, the source potential of the power MOS-transistor 21 for driving the lamps through the switching circuit 15, with the switch 11 being the On-condition, that is, the input voltage $V_{21s}$ to the differential amplifier circuit 25 becomes larger than the input voltage $V_{23s}$ supplied to the differential amplifier circuit 25 from the load equivalence circuit 41. Accordingly, the balance of the input voltages to the differential amplifier circuit 25 can not be maintained and the output voltage $V_o$ from the differential amplifier circuit 25 becomes smaller than the reference voltage of 0.47 V of the comparator 53 for detecting the disconnection of the lamps. As a result, only the disconnection signal Sb is produced from the comparator 53. This signal Sb is applied to, for instance, a maintenance panel, not shown, through the output terminal 59 for the disconnection signal, so as to display a fault indication.

Now, description will be mde for a case where any of the lamps of the load circuit 9 is short-circuited.

When the any of the lamps is in the short-circuited condition, the resultant resistance of the load circuit 9 becomes small, so that the input voltage $V_{21s}$ to the differential amplifier circuit 25 becomes smaller than the input voltage $V_{23s}$ to be supplied to the differential amplifier circuit 25 from the load equivalence circuit 41. As a result, the output voltage $V_o$ from the differential amplifier circuit 25 now becomes larger than the reference voltage Vrs of 8.0 V of the comparator 55 for detecting the short-circuited condition, and only the short circuit signal Ss is produced from the comparator 55. This signal Ss is applied, for instance, to the maintenance panel, not indicated, through the output terminal 57 for the short circuit signal, thus indicating the short-circuited condition of the lamps. The short circuit signal Ss is applied to the hold circuit 63 for driving the same. The output signal from the hold circuit 63 thus energized now renders the MOS-transistors 21 and 23 in the drive circuit 19 non-conductive and prevents an excessively large current from flowing through the power MOS-transistor 21 for driving the lamps. The non-conconductive condition of the power MOS-transistor 21 due to the hold circuit 63 is released through the reset circuit 65 when the switch 11 is turned off.

In the foregoing embodiment, the description has been made for the case where the operational amplifier 31 in the differential amplifier circuit 25 is supplied with the voltage two times higher than the power supply $+V_B$, which is supplied from the voltage stepping-up circuit 17, so that the operational amplifier can be realized by bipolar integrated circuits. However, when it is desired to realize the operational amplifier by a MOS-type FET operational amplifier in order to minimize the stand-by current, the power supply voltage may be $V_B$ in view of the restriction of tolerance for the IC and a voltage level shifting circuit can be inserted in series with the input resistors 27 and 29 of the operational amplifier 25.

Moreover, in the foregoing embodiment of the amplification factor $\mu$ is determined by the equation $\mu = R_{33}/R_{27}$. As described in the foregoing, when any of the lamps in the load circuit 25 is short-circuited, the input voltage $V_{21s}$ to the differential amplifier circuit 25 tends to be small, while the same input voltage $V_{21s}$ tends to be large when any of the lamps is disconnected. In addition, the amplitude of the voltage in this case will also be different or changable, with the result that handling of the voltage will become sometimes difficult. Therefore, it is preferable to utilize the two types of the amplification factors; the one for the short-circuited condition and the other for the disconnected condition of the lapms. This can be realized by connecting a circuit consisting of resistor and diode connected in series to the resistor 33, thus enabling the accuracy of detection to be high as well as reducing the manufacturing cost as a whole.

In the foregoing embodiment, the description has been made for the case where lamps are used as the load circuit 9. However, it is to be understood that the load circuit is not limited to the lamps. The load circuit may be realized by different means such as various resistance loads, e.g., heaters, inductance load, etc.

As described in the foregoing embodiment, in the load condition determining apparatus according to the present invention, the abnormal conditions of a load can be determined by driving the load, the conditions of which should be determined, through first switching means, then driving a load equivalence circuit means having substantially the same electrical characteristic as that of the load through said first switching means together with second switching means formed on a single chip, and finally comparing the output signal from the first switching means with the output signal from the second switching means. Accordingly, fluctuations in various electrical characteristics due to, for instance, change in temperature can be cancelled and abnormal conditions of the load can be accurately and economically detected as any correction circuit is not required.

Moreover, since the change in the rush current with the time elapsed is taken into consideration by the provision of the load equivalence circuit in the load condition determining apparatus according to the present invention, the abnormal conditions can be economically and rapidly detected, without necessitating any heat dissipation measures.

While the invention has been described in its preferred embodiment, it is to be understood that the words which have been used are words of description rather than limitation and that various changes and modifications may be made within the purview of the appended claims without departing from the true scope and spirit of the invention in its broader aspects.

What is claimed is:

1. A monitoring apparatus for indicating the normal and abnormal condition of an electrical load which comprises:
   (a) a powr supply;
   (b) a drive circuit having first and second type transistors and connected to said power supply at one end thereof;
   (c) a load circuit of an electrical device, one end of which is connected to the output of the first type transistor in said drive circuit and the other end of the which is connected to ground;
   (d) a load equivalence circuit having resistors and a capacitor, one end of said load equivalence circuit being connected to the output of said second type transistor in the drive circuit and the other end being connected to ground, whereby the electrical characteristic of said load equivalence circuit is substantially equal to that of said load circuit;
   (e) a differential amplifier circuit, the differential inputs of which are connected to the outputs of said first and second type transistors respectively so as to detect the difference between the input voltages to the differential amplifier circuit in accordance with the normal and abnormal conditions for said load circuit means; and
   (f) comparing means having first and second comparators with first and second reference voltages respectively and connected to the output of said differential amplifier circuit at the input thereof; thereby determining the normal and abnormal conditions of said load circuit in accordance with the balance and unbalance between the input voltages to the differential amplifier circuit.

2. A monitoring apparatus as claimed in claim 1 wherein said first and second type transistors are MOS-type transistors formed on a single chip.

3. A monitoring apparatus as claimed in claim 1 wherein said load circuit comprises a plurality of lamps such as stop lamps.

4. A monitoring apparatus as claimed in claim 3 wherein the time constant of the capacitor in the load equivalence circuit corresponds to the duration of the rush current flowing through the load circuit when truning on the lamps as a load circuit.

5. A monitoring apparatus as claimed in claim 4 wherein the time constant of the capacitor and the resistor in the load equivalence circuit is 10 msec.

6. A monitoring appatus as claimed in claim 1 wherein the resultant resistance of the resistors in the load equivalence circuit corresponds to the total equivalence resistance of the load circuit.

7. A monitoring apparatus as claimed in claim 2 wherein said comparing means has first and second comparators with a first reference voltage level Vrb applied to said first comparator for comparing the output signal from the differential amplifier circuit therewith and for detecting the disconnection of the load circuit and a second reference voltage level Vrs applied to said second comparator for comparing the output signal from the differential amplifier circuit therewith and for detecting the short-circuited condition of the load circuit.

8. A load condition determining apparatus as claimed in claim 7 wherein said first reference voltage level is 0.47 volts and said second reference voltage level is 8.0 volts.

9. A monitoring apparatus as claimed in claim 1 wherein said comparing means further comprises a time delay circuit for removing noise.

10. A monitoring apparatus as claimed in claim 1 wherein said apparatus further comprises protection circuit means having a hold circuit and a reset circuit for rendering said first and second type transistors in the drive circuit non-conductive so as to prevent an excessively large current from flowing into said first and second type transistors, when any abnormal conditions of the load circuit are detected.

11. A monitoring apparatus as claimed in claim 1 wherein said apparatus further comprises input voltage processing means having an switching circuit and a voltage stepping-up circuit and connected between said power supply and said drive circuit for applying a stepped-up voltage to the inputs of said first and second type transistors in the drive circuit from said power supply.

12. A monitoring apparatus as claimed in claim 11 wherein the stepped-up voltage from said voltage stepping-up circuit is two times the voltage of the power supply.

13. A monitoring apparatus as claimed in claim 11 wherein the voltage of said power supply is 12 volts.

14. A monitoring apparatus as claimed in claim 2 wherein the output voltage $V_o$ from the differential amplifier circuit is defined by the equation $$V_o = \mu(V_{23s} - V_{21s}) + V_c,$$

where $V_{21s}$ is the output voltage from the first type transistor, $V_{23s}$ is the output voltage from the second type transistor, $V_c$ is the neutral voltage at the junction between resistors in the differential amplifier circuit, and $\mu$ is the amplification factor in the differential amplifier circuit.

15. A monitoring apparatus as claimed in claim 14 wherein the amplification factor has different values for the short-circuited condition and the disconnected condition of the load circuit.

* * * * *